United States Patent [19]

Burke et al.

[11] 3,993,897

[45] Nov. 23, 1976

[54] SOLID STATE IMAGING APPARATUS

[75] Inventors: Hubert K. Burke, Scotia; Gerald J. Michon, Waterford, both of N.Y.

[73] Assignee: General Electric Company, Schenectady, N.Y.

[22] Filed: Nov. 26, 1975

[21] Appl. No.: 635,703

[52] U.S. Cl. .............................. 250/211 J; 307/304; 357/24; 357/32

[51] Int. Cl.[2] .............................. H01J 39/12

[58] Field of Search ............ 250/211 R, 211 J, 578; 307/304; 357/24, 30, 32; 340/166 R

[56] References Cited

UNITED STATES PATENTS 3,763,480 10/1973 Weimer .............................. 357/32

3,935,446 1/1976 Michon .............................. 250/211 J

*Primary Examiner*—David C. Nelms

*Attorney, Agent, or Firm*—Julius J. Zaskalicky; Joseph T. Cohen; Jerome C. Squillaro

[57] ABSTRACT

An array of charge storage devices each including a pair of closely coupled conductor-insulator-semiconductor cells, one a row line connected cell and the other a column line connected cell, is provided on a common semiconductor substrate. Read out of the charges stored in a row of devices is accomplished by obtaining the difference of pairs of signals, one sensed on the row line connecting the selected row of devices and the other of the signals sensed on the row line connecting an adjacent row of devices emptied of stored charge.

5 Claims, 30 Drawing Figures

Fig. 1.
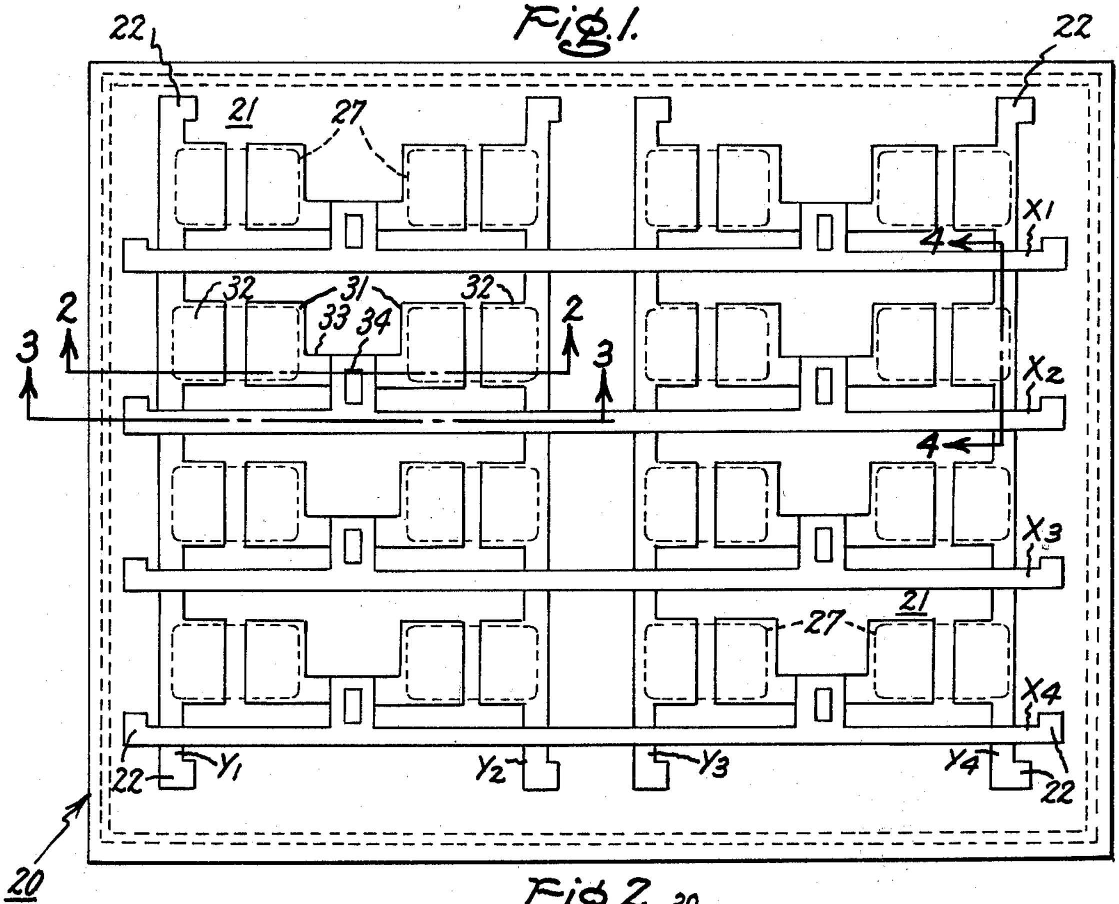
Fig. 2.
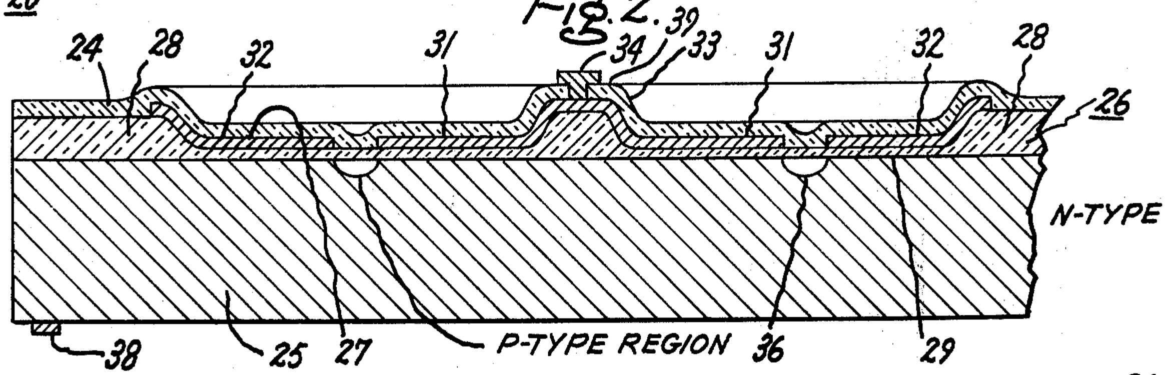
Fig. 3.
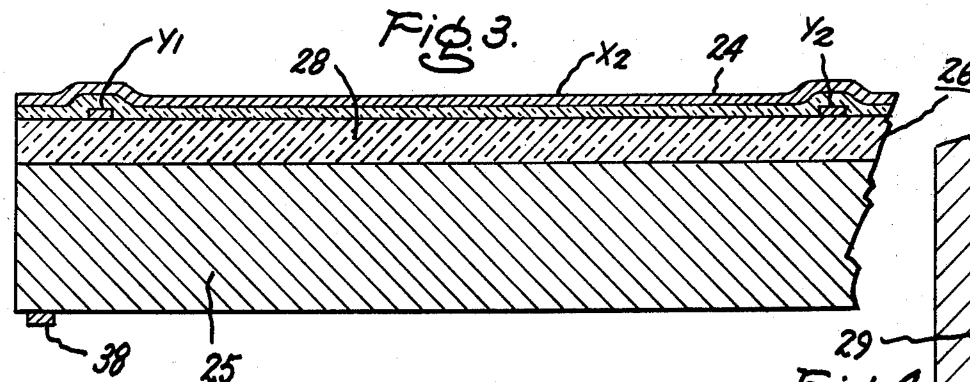
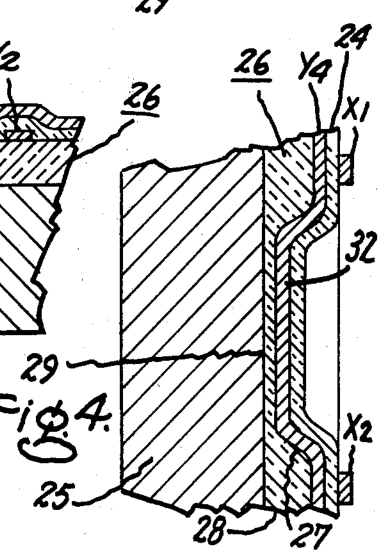
Fig. 4.

Y-AXIS CLOCK PULSES
0
-20V
TIME
52
t0 t1 t2 t3 t4 t5 t6 t7 t8 t9 t10

X-AXIS CLOCK PULSES
0
-20V
54
54

FRAME SYNC.
0
-20V
56

ROW SELECT GATE (READ X1)
0
-15V

ROW SELECT GATE (READ X2)
0
-15V

RESET GATE
0
-20V
80
80

INJECTION PULSES
0
-10V
77a
77a

RESTORER PULSES
0
-15V
84
84

ROW GATE VOLTAGE
0
-25V
98
98

SOLID STATE IMAGING APPARATUS

The present invention relates to apparatus including devices and circuits therefor for sensing patterns of radiation imaged thereon and developing electrical signals in accordance therewith. The present invention relates in particular to such apparatus which stores charge produced by electromagnetic rediation flux in the form of localized charges in a semiconductor substrate and which provides an electrical readout of the stored charge.

This application relates to improvements in the apparatus of U.S. Pat. No. 3,805,062 and patent application Ser. No. 554,155, filed Feb. 28, 1975, now U.S. Pat. No. 3,935,446 are assigned to the assignee of the present application and both of which are incorporated herein by reference thereto.

Radiation sensing apparatus such as referred to above include an array of charge storage devices on a common semiconductor substrate. Variations in the geometric organization and structure of the devices of the array produce a fixed spatial noise component in the output signal which limits the dynamic range of the apparatus.

The present invention is particularly directed to overcoming such limitations in solid state imaging apparatus.

A general object of the present invention is to provide improvements in solid state imaging apparatus.

Another object of the present invention is to simplify the structure and operation of solid state imaging apparatus and improve the performance thereof.

In carrying out the invention in one illustrative embodiment thereof there is provided substrate of semiconductor material of one conductivity type having a major surface. A plurality of first conductive plates are provided, each overlying and in insulated relationship to the major surface and forming a first conductor-insulator-semiconductor capacitor with the substrate. A plurality of second conductive plates are provided, each adjacant a respective first conductive plate to form a plurality of pairs of plates, the pairs of plates being arranged in a matrix of rows and columns, each of the second conductive plates overlying and in insulated relationship to the major surface and forming a second conductor-insulator-semiconductor capacitor with the substrate. Each second conductor-insulator-semicondictor capacitor is coupled to a respective first conductor-insulator-semiconductor cpacitor so as to permit the transfer of stored charge between them. A plurality of row conductor lines are provided, the first conductive plates in each of the rows are connected to a respective row conductor line. a plurality of column conductor lines are provided, the second conductive plates in each of the columns are connected to a respective column conductor line.

A first voltage means provides a first voltage between the row conductor lines and the substrate to deplete respective first portions of the substrate lying thereunder of majority charge carriers and provides an absolute potential of a first value therein. A second voltage means provides a second voltage between the column conductor lines and the substrate to deplete respective second portions of the substrate lying thereunder of majority charge carriers and provides an absolute potential of a seond value therein. Preferably, the second value of potential is substantially less than the first value of potential. Means are provided for storing charge in the first portions of the substrate. First means are provided for reducing the first voltage on each pair of adjacent row conductor lines in sequence to a first level during a respective first period of time to cause the first portions of the substrate associated with the respective pair of row lines to be reduced in absolute potential to a third value less than the second value whereby charge stored in the first portions transfers into respective second portions of the substrate associated with the respective pair of row lines. Second means are provided for reducing on each of the column conductor lines in sequence the second voltage to a second level during a respective second period of time shorter than the first period of time and thereafter reestablishing the second voltage to cause the second portions of the substrate to be reduced in potential to a fourth value less than the third value whereby charge stored in each of the second portions transfers into a respective first portion and back again to the second portion.

Each row line is included in two successive pairs of row lines whereby the first voltage thereon is reduced to the first level during an initial first period and also during a successive first period.

Means are provided for collapsing the first voltage on each of the row lines for an interval at the end of the initial first period therefor and for simultaneously collapsing the second voltage on all of the column lines during the interval to cause charge in the first portions of the substrate associated with the respective row line to be injected into the substrate.

Means are provided for sensing in sequence the elements of signal induced on each of the pair of row lines during the transfer of charge from the first portions to the second portions of the substrate associated with the pair of row lines.

Means are provided for obtaining a difference signal for each pair of signals appearing on the pair of row lines.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 1 is a plan view of an array or assembly of charge storage devices incorporated in the apparatus of the present invention shown in FIG. 5.

FIG. 2 is a sectional view of the assembly of FIG. 1 taken along section lines 2—2 of FIG. 1.

FIG. 3 is a sectional view of the assembly of FIG. 1 taken along section lines 3—3 of FIG. 1.

FIG. 4 is a sectional view of the assembly of FIG. 1 taken along section lines 4—4 of FIG. 1.

Figure 5:
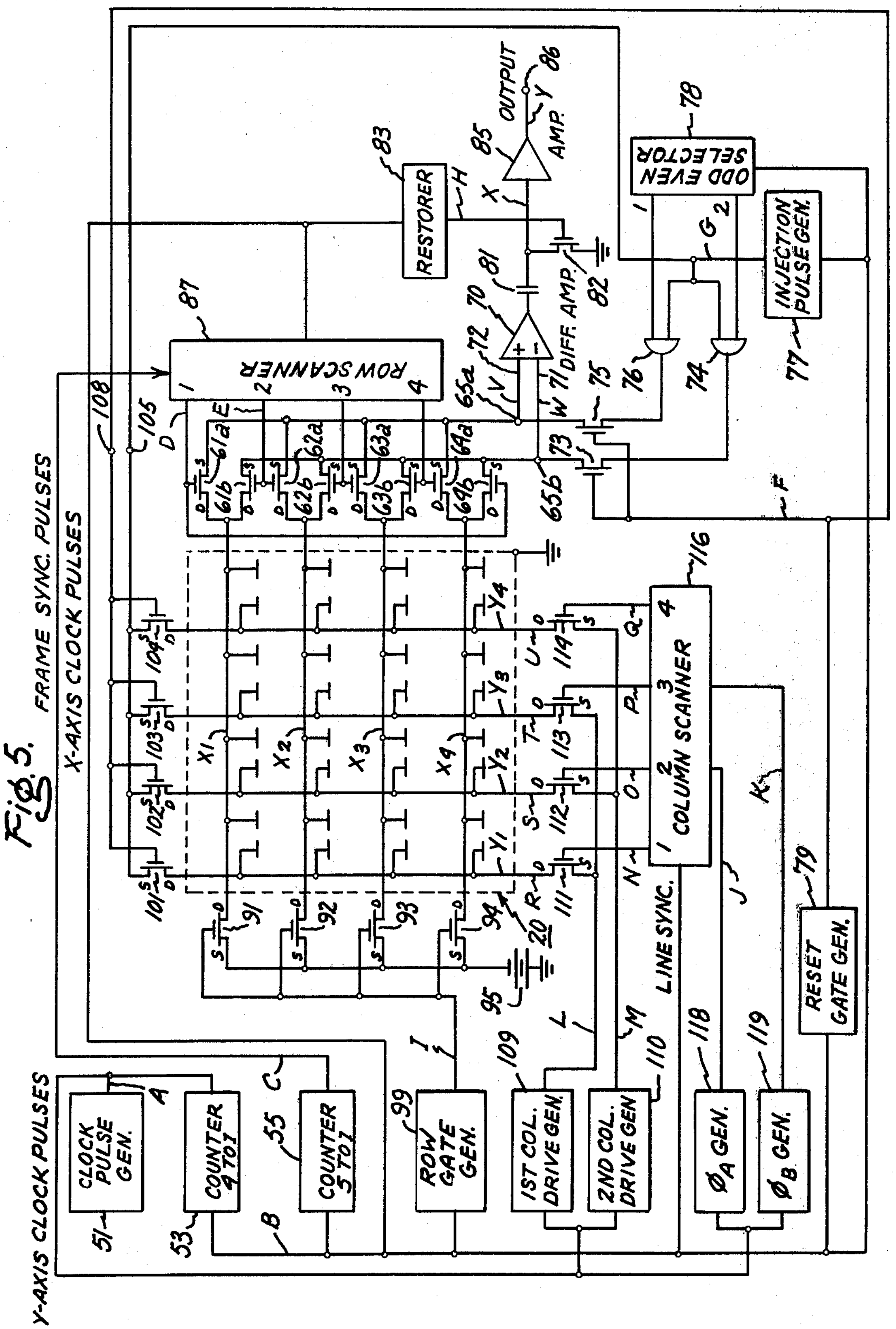
FIG. 5 is a block diagram of an image sensing apparatus in accordance with the present invention.

Before proceeding to describe the apparatus of FIG. 5 embodying the present invention the array of charge storage and radiation sensing devices used in the apparatus will be described. While a specific form of the array fabricated using a specific technology is shown and described, it will be understood that the array utilized in the apparatus may take on other forms and that any of the commonly used technologies for charge transfer devices may be used in the fabrication thereof. Reference is now made to FIGS. 1–4 which show an array 20 of charge storage and radiation sensing devices 21, such as the device described in FIGS. 2A, 2B and 2C. of aforementioned U.S. Pat. No. 3,805,062 arranged in four rows and columns. The array includes four row conductor lines, each connecting the row-oriented plates of a respective row of devices, and are designated from top to bottom $S_1$, $X_2$, $X_3$ and $X_4$. The array also includes four column conductor lines, each connecting the column-oriented plates of a respective column of devices, and are designated from left to right $Y_1$, $Y_2$, $Y_3$ and $Y_4$. Conductive connections are made to lines through conductive landings or contact tabs 22 provided at ach end of each of the lines. While in FIG. 1 the row conductor lines appear to cross the column conductor lines, the row conductor lines are insulated from the column lines by a layer 24 of transparent glass as is readily apparent in FIGS. 2, 3 and 4. In FIG. 1 the outline of the structure underlying the glass layer 24 is shown in solid outline for reasons of clarity.

The array includes a substrate or wafer 25 of semiconductor material of N-type conductivity over which is provided an insulating layer 26 contacting a major face of the substrate 25. A plurality of deep recesses 27 are provided in the insulating layer, each for a respective device 21. Accordingly, the insulating layer 26 is provided with thick or ridge portion 28 surrounding a plurality of thin portions 29 in the bottom of the recesses. In each of the recesses is situated a pair of substantially identical conductive plates or conductive members 31 and 32 of rectangular outline. Plate 31 is denoted a row-oriented plate and plate 32 is denoted a column oriented plate. The plates 31 and 32 of a device 21 are spaced close to one another along the direction of a row and with adjacent edges substantially parallel. In proceeding from the left hand portion of the array to the right hand portion, the row-oriented plates 31 alternate in lateral position with respect to the column oriented plates 32. Accordingly, the row-oriented plates 31 of pairs of adjacent devices of a row are adjacent and are connected together by a conductor 33 formed integral with the formation of the plates 31. With such an arrangement a single connection 34 from a row conductor line through a hole 39 in the aforementioned glass layer 24 is made to the conductor 33 connecting a pair of row-oriented plates. The column-oriented conductor lines are formed integrally with the formation of the column-oriented plates 32. The surface adjacent portion of the substrate 25 underlying the space between the plates 31 and 32 of each device 21 is provided with a P-type conductivity region 36. The glass layer 24 overlies the thick portion 28 and thin portion 29 of the insulating layer 26 and the plates 31 and 32, conductors 33 and column-oriented conductor lines $Y_1$–$Y_4$ thereof except for the contact tabs 22 thereof. The glass layer 24 may contain an acceptor activator and may be utilized in the formation of the P-type region 36. A ring shaped electrode 38 is secured to the major surface of the substrate opposite the major surface on which the devices 21 were formed and provides conductive connection to the substrate. Such a connection to the substrate permits rear face as well as front face illumination of the array.

The array 20 and the devices 21 of which they are comprised may be fabricated using a variety of materials and in variety of sizes in accordance with established techniques for fabricating integrated circuits as described in the aforementioned U.S. Pat. No. 3,805,062.

Referring now to FIG. 5 there is shown a block diagram of apparatus utilizing the charge storage array of FIG. 1 which provides a video signal in response to radiation imaged on the array by a lens system (not shown), for example. The video signal may be applied to a suitable display device (not shown) such as a cathode ray tube as described in the above-referenced U.S. Pat. No. 3,805,062 along with sweep voltages synchronized with the scanning of the array to convert the video signal into a visual display of the image.

The system will be described in connection with FIGS. 6A–6Y which show diagrams of amplitude versus time of signals occurring at various points in the system of FIG. 5. The point of occurrence of a signal of FIGS. 6A–6Y is referenced in FIG. 5 by a literal designation corresponding to the literal disignation of the figure reference.

Figures 6A, 6B, 6C, 6D, 6E, 6F, 6G, 6H, 6I:
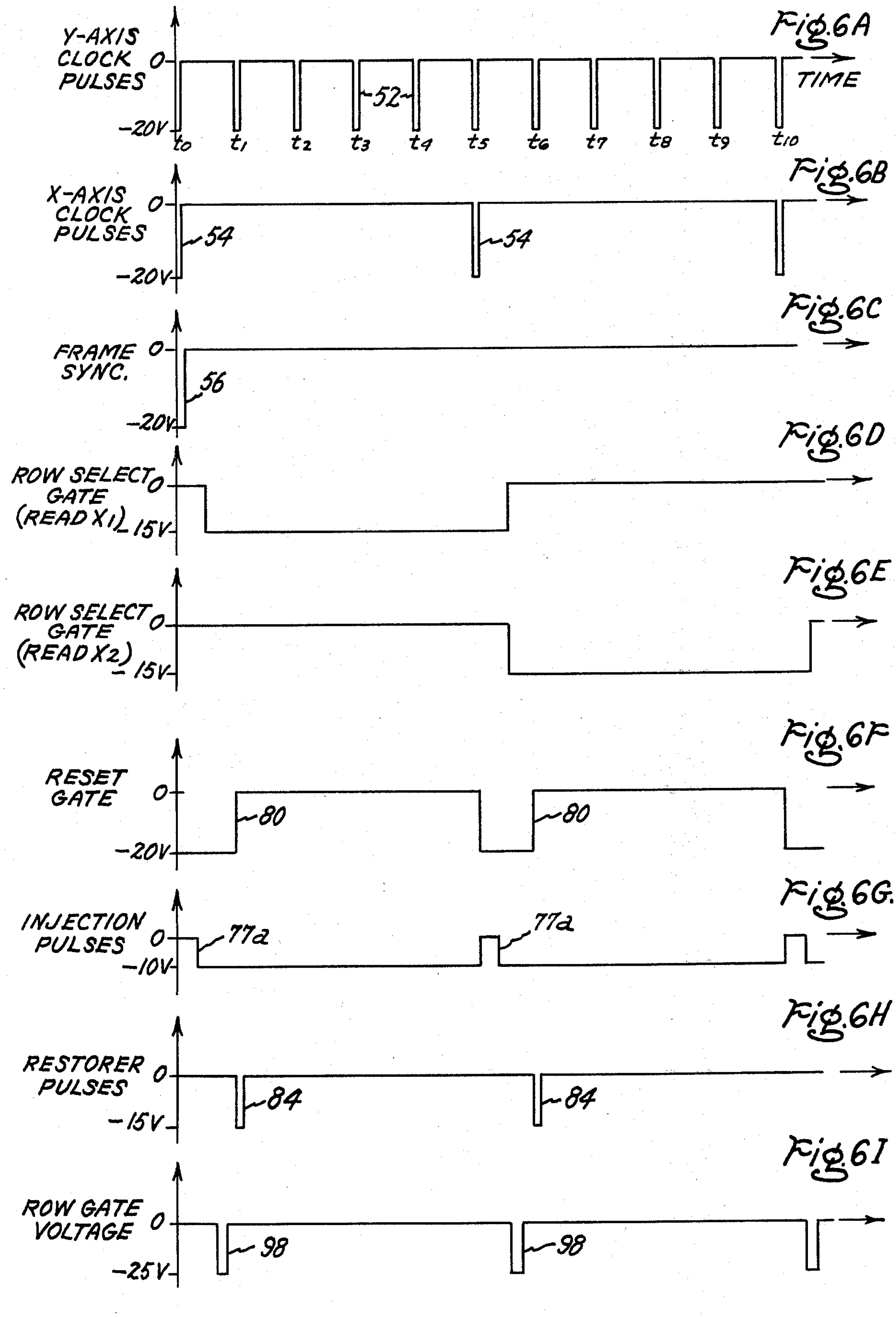
FIGS. 6A through 6Y are diagrams of amplitude versus time of voltage signals occurring at various points in the system of FIG. 5. The point of occurrence of a signal of FIGS. 6A–6Y in the block diagram of FIG. 5 is identified in FIG. 5 by a literal designation corresponding to the literal designation of the FIGS. 6A–6Y.

The system includes a clock pulse generator 51 which develops a series of regularly occurring Y-axis pulses 52 of short duration shown in FIG. 6A, occurring in sequence at instants of time $t_o$–$t_{10}$ and representing a half scanning cycle of operation of the array. The output of the clock pulse generator 51 is applied to a first counter 5? which divides the count of the clock pulse generator by four to derive X-axis clock pulses 54, such as shown in FIG. 6B. The output of the first counter 53 is also applied to a second counter 55 which further divides the count applied to it by five to provide frame synchronizing pulses 56 to the array.

The sensing array 20, which is identical to the sensing array of FIG. 1 and is identically designated, includes row conductor lines $X_1$ thru $X_4$ and column conductor lines $Y_1$ thru $Y_4$. The drive circuits for the row conductor lines $X_1$–$X_4$ and for the column conductor lines $Y_1$-$Y_4$ of array 20 are included on the same substrate 50 as the array to minimize the number of external connections which are required to be made for connection of the array 20 in the system.

To enable selective read out of a row of devices a plurality of pairs of row-enable switches $61_a$–$64_a$ and $61_b$–$64_b$ are provided. The row-enable switches $61_a$–$64_b$ are in the form of MOSFET transistor devices formed integrally on the substrate, each having a source electrode, a drain electrode and a gate electrode. Each of the drains of devices $61_a$–$64_a$ and each of the drains of the devices of $61_b$–$64_b$ is connected to one end of a respecitve one of the row conductor lines $X_1$–$X_4$. Each of the sources of the devices $61_a$–$64_a$ is connected to row bias terminal $65_a$. Each of the sources of devices $61_b$–$64_b$ is connected to row bias terminal $65_b$. The terminal $65_b$ is connected to the inverting terminal 71 of a differential amplifier 70. The output terminal $65_a$ is connected to the non-inverting 72 terminal of the differential amplifier 70. (A change in voltage at the inverting input terminal of the differential amplifier in one direction in relation to a reference potential produces a change in voltage at the output terminal in the opposite direction in relation to the reference potential. A change in voltage at the non-inverting terminal in one direction in relation to a reference potential produces a change in voltage at the output terminal in the same direction in relation to the reference potential).

The terminal **65*b* is connected through the source-drain conduction path of reset transistor 73 to the output of the AND gate 74. The terminal 65a is connected through the source-drain conduction path of the reset transistor 75 to the output of the AND gate 76. The AND gate 74 has a pair of input terminals one of which is connected to the output of the injection pulse generator 77 from which the injection pulses 77*a* of FIG. 6G are obtained. The injection pulse generator 77 is synchronized with the X-axis clock pulses. The other terminal of the AND gate 74 is connected to the even terminal, designated terminal 2, of the odd-even selector 78 which provides a pair of outputs at terminals 1 and 2. The AND gate 76 also has a pair of input terminals one of which is connected to the output of the injection pulse generator 77 and the other input terminal of which is connected to the odd terminal, designated terminal 1, of the odd-even selector 78. The odd-even selector 78 is synchronized with the X-axis clock pulses and provides an output on terminal 1 during the scanning of the odd lines of the array and an output on terminal 2 during the scanning of the even rows of the array. The AND gates 74 and 76 are set so that row readout potential of -6 volts appear at the outputs thereof in the absence of a pair of signals at the input thereof. During the scanning of an odd numbered row of the array the AND gate 76 provides a zero voltage output during the occurrence of the injection pulses 77*a* of FIG. 6G. During the scanning of an even numbered row of the array the AND gate 74 provides zero voltage output during the occurrence of the injection pulses 77*a* of FIG. 6G.**

The gates of the reset transistor 73 and 75 are connected together and to the output of the reset gate generator 79 on which appears the voltage pulses 80 of FIG. 6F synchronized with the X-axis clock pulses. During the reset interval of pulse 80 the voltages appearing at the output of the AND gates 74 and 76 are applied to the terminals **65*b* and 65*a*** to enable readout of the devices in each of the rows, as will be explained below.

The output of the differential amplifier 70 is connected through a capacitor 81 and the source drain conduction path of transistor 82 to ground. The gate of the transistor 82 is connected to the output of restorer circuit 83 which is synchronized with the X-axis clock pulses and provides restorer pulses 84, shown in FIG. 6H, which are utilized to reference the output of the differential amplifier at the beginning of each row of scan. The output of the differential amplifier 70 is coupled through the capacitor 81 to the amplifier 85, output from which is obtained at terminal 86.

The gate electrodes of the transistor pairs **61*a* and 64*b*, 62*a* and 61*b*, 63*a* and 62*b*, 64*a* and 63*b* are connected to successive output terminals of the row shift register 87, numbered respectively 1, 2, 3 and 4. The outputs at terminals 1 and 2 of the row shift register are shown, respectively, in FIGS. 6D and 6E. The outputs at terminals 3 and 4 are similar to output of terminal 1 except appropriately delayed in time to occur during the third and fourth row line scan periods, respectively. The input to row shift register 87, referred to as the frame sync pulse, is the pulse obtained at the output of the second counter 55. One frame sync pulse occurs for every 20 Y-axis clock pulses. Oppositely phased clock drive pulses for the row shift register 87 are derived from the X-axis clock pulses. The oppositely phased drive line pulses are applied to each of the stages of the row shift register 87 to produce the indicated outputs at the terminals 1–4 thereof. The row shift register 87 may be any of a number of shift registers known to the art. The elements of the shift register 87 may be concurrently formed on the substrate at the same time that the devices of the array 20** are formed.

During the occurrence of the gating pulse of FIG. 6D on terminal 1 of the row scanner 87, transistors **61*a* and 64*b* are turned on, connecting row $X_1$ to terminal 65*a* and connecting row line $X_4$ to terminal 65*b*. Prior to the instant of time $t_0$, the devices of row $X_4$ have been read out and the charge stored in these devices has been injected into the substrate by the occurrence of an injection pulse 77*a* of FIG. 6G at the output of the AND gate 74 during the reset interval of pulse 80 of FIG. 6F. At the instant of time $t_1$, after the occurrence of reset pulse 80 applied to reset switches 73 and 75,** the voltage on the lines $X_4$ and $X_1$ is set at −6 volts and any charge in the devices of row $X_4$ and $S_1$ is now located in the column cells of the devices, the column lines being at −10 volts.

The pulses appearing on the colummn lines $Y_1$ to $Y_4$ to effect readout are shown, respectively, in FIGS. 6R thru 6U. The pulse applied to column line $Y_1$ raises voltage thereof to zero volts during the interval $t_1$ to $t_2$. Similarly the column lines $Y_2$ thru $Y_4$ are raised to zero volts during intervals $t_2$ to $t_3$, $t_3$ to $t_4$, to $t_5$, respectively. The first device in the first row $X_1$ is read out by the rise in potential of the $Y_1$ line to zero volts which causes charge stored in the column cell to transfer into the row cell of the first device. The transferred charge is sensed on terminal **65*a* connected to line $X_1$ thru transistor 61A. Simultaneously, the signal on line $X_4$ due to the transfer of charge in the column cell of the first device in the fourth row into the row cell thereof is sensed on terminal 65*b*. As terminal 65*a* is connected to the non-inverting terminal of the differential amplifier 70 and as terminal 65*b* is connected to the inverting terminal of the differential amplifier 70, an output is obtained from the amplifier which is the difference of the two signals. The other devices of the rows $X_1$ and $X_4$ are similarly sensed and differential outputs obtained. This mode of sensing eliminates components in the resultant signals which are due to geometrical nonuniformities in the devices of the array and which are referred to as pattern noise. At the end of the period of scan of the devices of rows $X_1$ and $X_4$, the reset pulse 80 of FIG. 6F is applied to the gates of the reset transistors 73 and 74 which allows the injection pulse 77*a* of FIG. 6G to appear on terminal 65B** and raise the potential of the $X_1$ line to zero to cause injection of the stored charge into the substrate. As will be explained below, during the interval of time that the row line $X_1$ is raised to zero volts the voltages on the column lines which are at −10 volts are raised to zero volts to enable injection of the charge stored in the devices of the row $X_1$ into the substrate.

To reestablish storage voltage on all of the row lines, row reset switches 91–94 are provided. The reset switches 91–94 are in the form of MOSFET transistors integrally formed on the substrate 50, each having a drain electrode connected to the other end of a respective one of the row conductor lines $X_1$–$X_4$ and each having a source electrode connected to the negative terminal of source 95, the positive terminal of which is connected to ground. Each of the gate electrodes of the transistor 91–94 is driven by a common drive signal 98 shown in FIG. 6I obtained from the output of row gate generator 99 and synchronized with the X-axis clock pulses of FIG. 6B.

Note that the time of the occurrence of the row gating pulse 98 of FIG. 6I occurs subsequent to the occurrence of the injection pulse 77*a* of FIG. 6G which occurs during the reset gate pulse 80 of FIG. 6F. The occurrence of the reset gate pulse 80 of FIG. 6F extends beyond the time of occurrence of the row gate pulse 98 of FIG. 6I. Accordingly, when the row gate voltage of FIG. 6E appearing on terminal 2 of the row scanner 87 goes negative and turns on the row enable switches 61*b* and 62*a*, the read out potential of −6 volts from the AND gates 74 and 76 appears on row line $X_1$ and also on row line $X_2$. The lines $X_1$ and $X_2$ remain at these potentials when the reset switches 74 and 76 are turned off. It should be noted that the row lines other than $X_1$ and $X_2$ are floated at −20 volts by row gate pulses 98 of FIG. 6I. The devices of row $X_2$ are read out in the same manner in which the devices of row $X_1$ are read out. In this case, however, the row $X_1$ is connected through switch 61*b* to the inverting terminal 71 of the differential amplifier 70 and the row line $X_2$ is connected through transistor 62*a* to the noninverting terminal 72 of the differential amplifier.

To enable injection of charges from a row devices which have just been scanned it is essential not only to drop the row line voltage to zero but also to set the column line voltages to zero for a short interval of time as pointed out above. This latter function is performed by the column line switches 101 thru 104 in the form of MOSFET transistors integrally formed om the substrate and each having a source electrode, a drain electrode and a gate electrode. Each of the drains of the devices 101 thru 104 is connected to one end of a respective one of the column lines $Y_1$ thru $Y_4$ and each of the sources is connected to the column drain terminal 105 which in turn is connected to the output of the injection pulse generator 77. Each of the gates of the devices 101–104 is connected to gate terminal 108 which in turn is connected to the output of the reset gate generator 79. Thus, during the occurrence of the reset gate pulse 80 of FIG. 6F and the injection pulse 77*a* of FIG. 6G, the column lines $Y_1$–$Y_4$ are at zero volts thereby enabling the injection into the substrate of charge stored in the devices of the row just read. The sensing of the charge stored in the devices of row $X_3$ and row $X_4$ is accomplished in a manner similar to the manner in which the sensing of the charge stored in rows $X_1$ and $X_2$ is accomplished.

The column line pulses of FIGS. 6R thru 6U are provided by the first column drive generator 109 and the second column drive generator 110 through a plurality of column line drive switches in the form of MOSFET transistors 111–114. Each of the transistors 111–114 has a drain electrode connected to the other end of a respective one of the column lines $Y_1$ thru $Y_4$. The source electrodes of the odd numbered transistors 111 and 113 are connected to the first column drive generator 109 and the sources of the even numbered transistors 112 and 114 are connected to the second column drive generator 110. The pulses provided at the output of the first column drive generator 109 and the second column drive generator 110 are shown respectively in FIGS. 6L and 6M. The first column drive generator provides a 10 volt pulse from a base reference of −10 volts during intervals $t_1$–$t_2$ and $t_3$—$t_4$. The second column drive generator provides a 10 volt pulse from a −10 volt base during intervals $t_2$–$t_3$ and $t_4$–$t_5$. The gates of the transistors 111–114 are connected respectively to terminals 1–4 of the column scanner 116. The outputs of the column scanner 116 at terminals 1–4 are shown in FIGS. 6N thru 6Q, respectively. The sequentially occurring pulses from the output terminals of the column scanner overlap, that is, the outputs from terminals 1 and 2 are both ON during the interval $t_1$–$t_2$, the outputs from terminals 2 and 3 are both ON during the interval $t_2$–$t_3$, and the outputs from terminals 3 and 4 are both on during the interval $t_3$–$t_4$. Thus, during the switching of column drive pulses occuring at the instant $t_2$ the voltage on line $Y_1$ (FIG. 6L) drops from zero volts to −10 volts and the voltage on line $Y_2$ (FIG. 6M) rises from −10 volts to zero volts. With the drop in voltage on line $Y_1$ balanced by the rise in voltage on line $Y_2$, the coupling of voltages from the column lines $Y_1$ and $Y_2$ to the row lines is minimized. Similar column voltage balancing occurs at instants $t_3$ and $t_4$. Also, any voltages capacitively coupled from the column lines to a pair of row lines which are connected to the input of differential amplifier 70 would be rejected. In view of the fact that they are common mode signals as the change in voltage on column one line is balanced by the change in voltage on an adjacent column line, the need for special output sampling circuits is eliminated. Concurrently the noise band width requirement of the read out circuit of the apparatus is reduced.

Figure 6J:
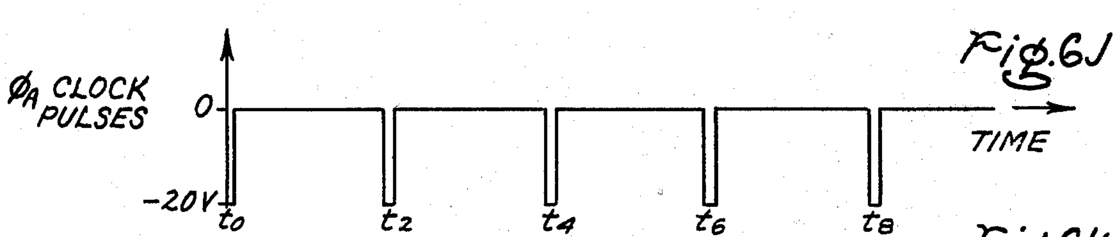
Figure 6K:
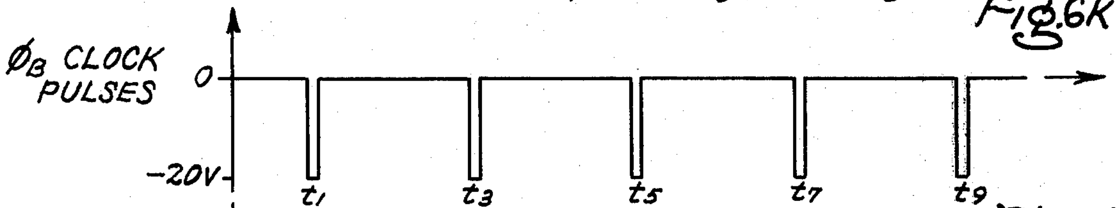
Figure 6L:
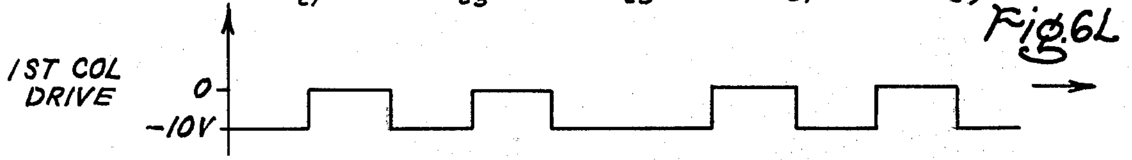
Figure 6M:
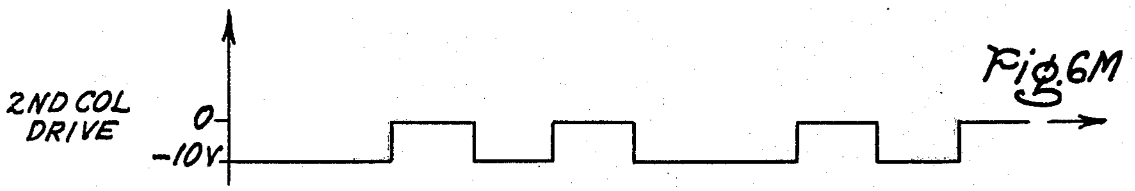
Figure 6N:
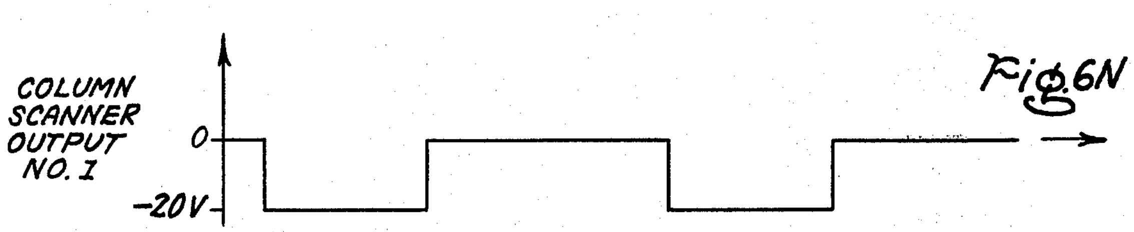
Figure 6O:
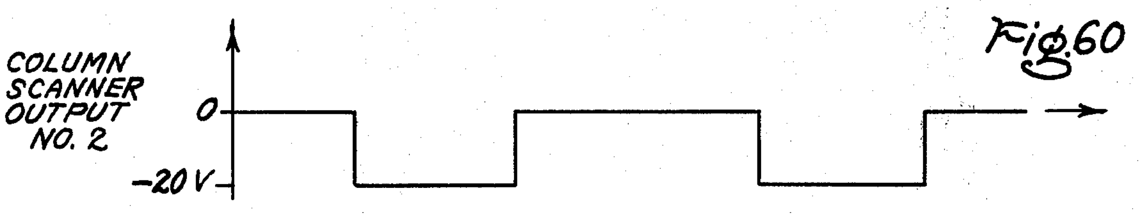
Figure 6P:
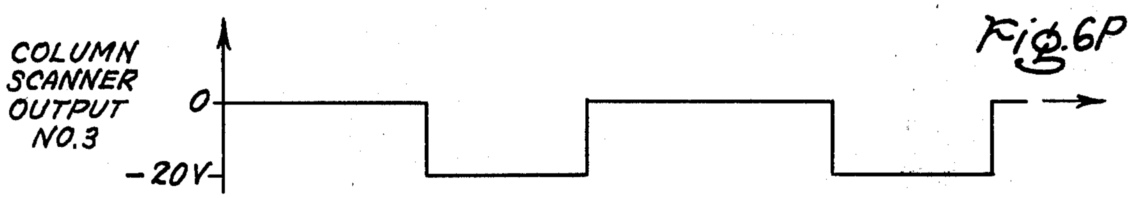
Figure 6Q:
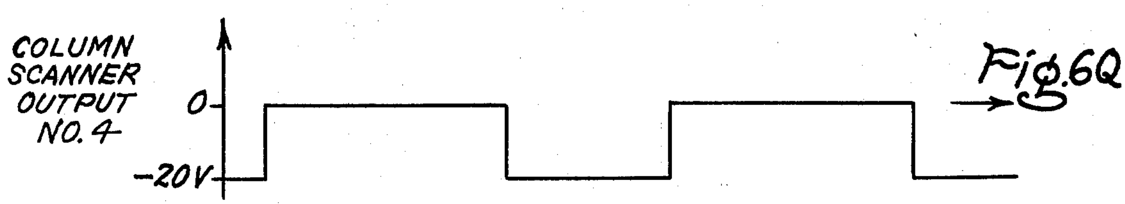
Figure 6R:
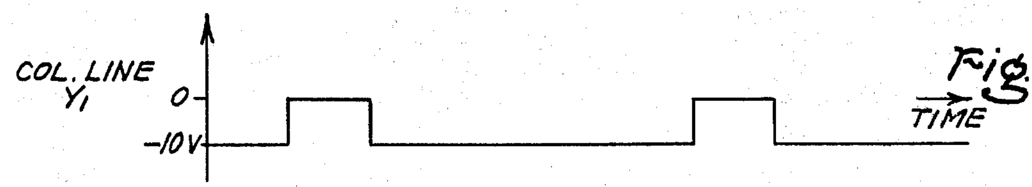
Figure 6S:
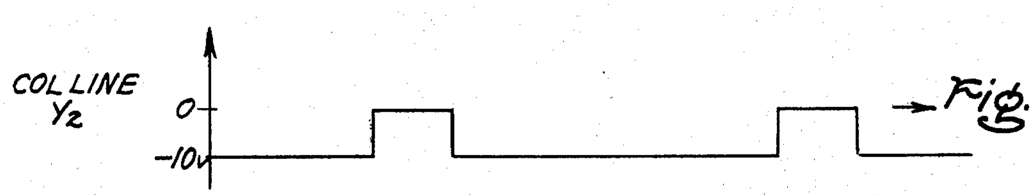
Figure 6T:
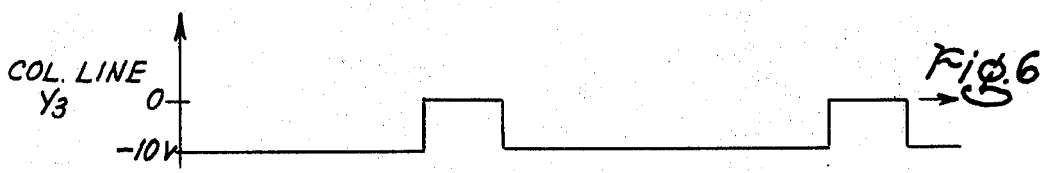
Figure 6U:
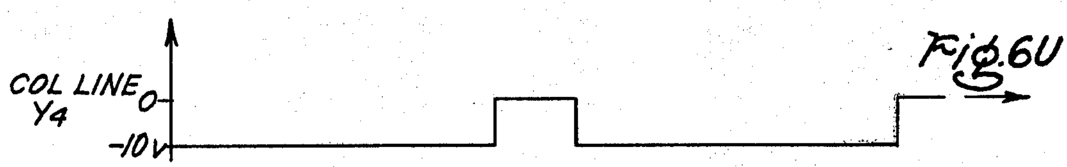

To provide the outputs of FIG. 6N thru 6Q at the terminals 1–4 of the column scanner 116 line synchronizing pulses from the output of counter 53 are applied to the input of the column scanner 116, and in addition, pulses from the $0_A$ generator 118 and the $0_B$ generator 119, shown respectively in FIGS. 6J and 6K, are applied. The $0_A$ generator 118 applies the even numbered pulses of the clock pulse generator 51 to the column scanner 116 and the $0_B$ generator 119 applies the odd numbered pulses of the clock pulse generator 51 to the column scanner 116. From the applied input information the column scanner develops the outputs 6N thru 6Q at the output terminals 1–4 thereof.

As mentioned above, the selected pair of rows of devices is read out by resetting the selected pair of row lines to their readout level of voltage of −6 volts and allowing the row lines to float, any uncertainty in the voltage appearing on the selected lines when the switches 73 and 75 are opened will appear at the output of the amplifier as an interferring signal. To minimize this interferring signal or noise, the restorer circuit including the capacitor 81, the transistor 82, and the restorer 83 are provided. After the reset switches 73 and 75 are closed by the return of the reset gate voltage of FIG. 6F to zero, the restorer pulse of FIG. 6H is applied to the gate of the transistor 82 to absorb the interferring signal across capacitor 81. In subsequent sensing of devices on the selected rows, the net output voltage of the differential amplifier 70 has subtracted from it the noise voltage on capacitor 81, and accordingly the input voltage applied to the amplifier 84 is relatively free of this component of noise.

Figure 6V:
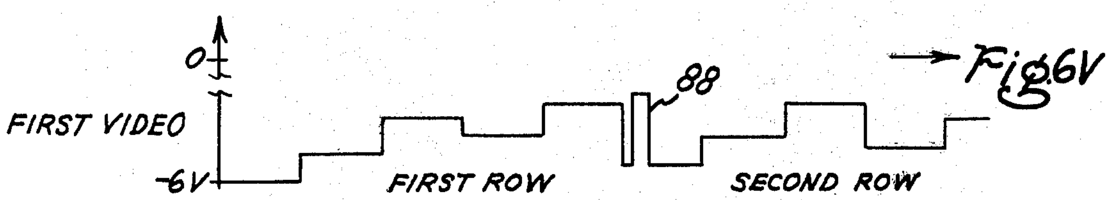
Figure 6W:
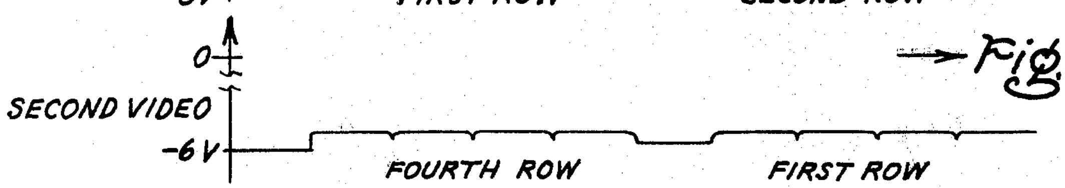
Figure 6X:
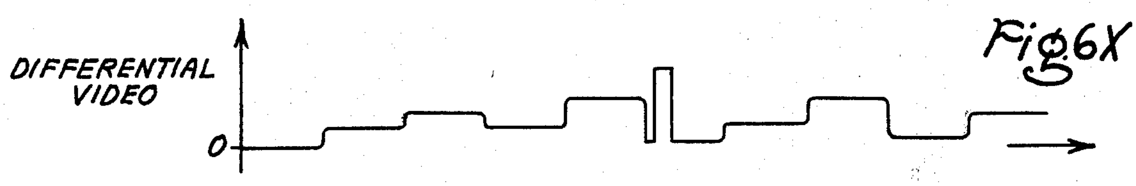
Figure 6Y:
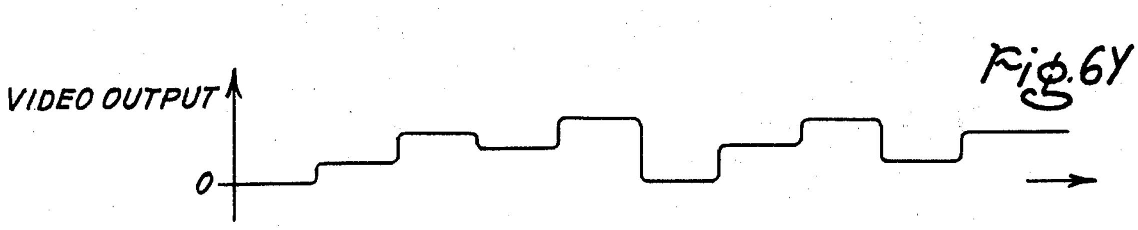

The scanning of the devices of row $X_1$ and row $X_2$ of the array in accordance with the present invention provides a first video signal at terminal 65*a* such as shown in FIG. 6V and also provides a second video signal at terminal 65*b* such as shown in FIG. 6W. On the basis of the assumption that the charge levels in the devices of the first or $X_1$ row are in the relative proportions of 1, 3, 2, 4, respectively, and the charge levels of the devices in the second or $X_2$ row are in the relative proportions of 2, 4, 1, 3, respectively, the video voltage on terminal 65*a* for the two rows is as shown. The first half of the second video signal of FIG. 6W shows the signal sensed in the empty devices of the fourth row and the second half of the video signal of FIG. 6W shows the signal sensed in the empty devices of the first row. The differential amplifier 70 takes the difference of the voltages of FIGS. 6V and 6W and provides the differential video voltage shown in FIG. 6X. The amplified video, shown in FIG. 6Y, appears at the output of amplifier 84. The pulse 88 appearing in the interval $t_5$–$t_6$ of the first video signal of FIG. 6V is produced by charge injection at the end of a row of scan and is removed in the video output of FIG. 6Y by the amplifier 85.

In the operation of the apparatus the voltage of the row line source 95 which is shown as −20 volts establishes a charge storage capability of the row connected or oriented cells of each of the devices of the array and the base voltage of −10 volts of the outputs of the first column drive generator and the second column drive generator shown in FIG. 6L and 6M establishes the charge storage capability of the column connected or oriented cells of each of the devices of the array. Under the control of the clock pulse generator, frame synchronizing pulses such as show in FIG. 6C, are applied to the row scanner 87. Line interval gating pulses, two of which are shown for lines $X_1$ and $X_2$ in FIGS. 6D and 6E, respectively, are derived at the output points 1–4 of the row scanner 87 in response to line rate clocking of the row scanner by the X-axis clock pulses. The line interval gating pulses are utilized to gate in sequence the pairs of row enable switches 61*a* and 64*b*, 62*b*, 61*b*, and 63*a* and 62*b*, 64*a* and 63*b* to apply in sequence the readout voltage level appearing on terminals 65*a* and 65*b* to sequential pairs of row lines $X_1$–$X_4$.

The readout voltage level of −6 volts is applied to the terminals 65*a* and 65*b* through reset switches 73 and 75 which are turned on at the end of a row scan operation to apply the outputs of the AND gates 74 and 76, the output levels of which are −6 volts, to the terminals 65*a* and 65*b* and hence to a pair of row lines. As pointed out above, during the reset interval of the pulse 80 (FIG. 6F) one of the pair of row lines is raised (pulse 77*a* of FIG. 6G) to zero volts by action of the injection circuit 77 and the odd-even selector circuit 78 to empty that row of the pair of rows which has been read out. During the injection interval the voltage of the column line conductors $Y_1$–$Y_4$ through the action of the switches 101 thru 104 is maintained at zero volts. Thus, during the reset gate interval of pulse 80 of FIG. 6F, the charge stored in the row of devices just sensed is injected into the substrate.

The switching actions that takes place in the transition from the readout of one row to the readout of the next row will be explained in connection with the transition from the first or $X_1$ row to the second or $X_2$ row. Prior to the turning off of row enable switches 61*a* and 64*b*, injection pulse 77*a* of FIG. 6G raises the potential of the line $X_1$ to zero volts and concurrently the action of the pulses of FIG. 6F and 6G applied to the column injection switches 101–104 raises the column line voltage to zero. Accordingly, the stored charge which had just been sensed on the first row line is injected into the substrate after devices 61*b* and 62*a* are turned on, the row gate voltage pulses 98 of FIG. 6I applied to the row reset switches 91 thru 94 resets the row lines to −20 volts and floats them. However, as the reset switches 73 and 75 are open for the entire interval $t_5$–$t_6$ the final voltage appearing on row lines $X_1$ and $X_2$ on closing of the reset switches 73 and 75 is the readout bias voltage of −6 volts from the AND gates 74 and 76. Thus rows $X_1$ and $X_2$ are set up to read out with row $X_1$ being empty of charge.

Readout of the devices of the second row is accomplished by applying successively the pulses shown in FIGS. 6R thru 6U to the column lines $Y_1$ thru $Y_4$. Successively, the voltage on the colummn lines is raised to zero volts and then dropped to the storage potential of −10 volts to cause transfer of charge from the column-connected cell to the row-connected cell and back again to the column-connected cell. Each such transfer of charge into a row cell causes a change in the voltage on the row lines $X_1$ and $X_2$. The difference in voltage on the row lines is obtained by the differential amplifier 70 which provides a differential video output. The differential video output is amplified by amplifier 84 to provide the video output of FIG. 6Y.

In the apparatus of the present invention as signal sensing is associated with the row lines and the high speed switching is associated with the column lines, the effect of switching transients on signal sensing is minimized. In addition balancing the decay in voltage on one column line with the rise in voltage on the adjacent column line eliminates the need for sampling to obtain the output video signal.

In the apparatus of the present invention, as differential read out of a pair of row lines is utilized, saturation of the storage devices of the rows which produces common mode signals are rejected and do not appear in the output signal.

While the apparatus of the invention described in connection with FIG. 5 included the array of FIG. 1, it is apparent that other arrays, such as the array described in U.S. Pat. No. 3,882,531, assigned to the assignee of the present invention, and including a semiconductor substrate of one conductivity type having an epitaxial layer of the opposite type thereon, may be used.

While in the exemplary embodiment of the invention the potential applied to row lines is twice the potential applied to the column lines, other ratios of potentials may be utilized provided the potential utilized for the row lines is sufficiently greater than the potential utilized for the column lines so that charge stored in a device may be stored entirely in the row connected cell of the device.

While in the exemplary embodiment injection from a row of devices is accomplished by collapsing the potential on the row line to the potential of the substrate, such a requirement is not essential. A small bias corresponding to the threshold voltage of the conductor-insulator-semiconductor storage capacitor or cell may be maintained between the row line being addressed and the substrate to maintain a bias charge in the row connected cell to avoid the adverse effects of emptying and filling the surface states of semiconductor substrate. Of course, when the voltage on a row line is collapsed to inject charge into the substrate, the voltage on the column lines should be at the same bias potential. In addition to avoiding adverse effects such as produced by the existence of surface states in the substrate, the bias charge in the cells of the device facilitates transfer of charge between the row connected and column connected cells of a device. This mode of operation is illustrated and explained in the aforementioned U.S. Pat. 3,805,062 in connection with FIGS. 9A–9E thereof.

While the invention has been described in connection with an array of sixteen devices, it is apparent that the invention is particularly applicable to arrays including devices many orders of magnitude greater in number than sixteen. Also, the devices may be organized in arrangements other than shown.

While the invention has been described in connection with an array constituted of an N-type conductivity substrate, a P-type conductivity substrate could as well be used. Of course, in such a case the applied potentials would be reversed in polarity.

While the invention has been described in specific embodiments, it will be appreciated that modifications, such as those described above, may be made by those skilled in the art, and it is intended by the appended claims to cover all such modifications and changes as fall within the true spirit and scope of the invention.

What we claim as new and desire to secure by Letters Patent of the United States is:

1. In combination, a substrate of semiconductor material having a major surface, a plurality of first conductive plates, each overlying and in insulated relationship to said major surface and forming a first conductor-insulator-semiconductor capacitor with said substrate, a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor, a plurality of row conductor lines, the first conductive plates in each of said rows connected to a respective row conductor line, a plurality of column conductor lines, the second conductive plates in each of said columns connected to a respective column conductor line, a first voltage means for providing a first voltage between said row conductor lines and said substrate to deplete respective first portions of said substrate lying thereunder of majority charge carriers and provide an absolute potential of a first value therein, a second voltage means for providing a second voltage between said column conductor lines and said substrate to deplete respective second portions of said substrate lying thereunder of majority charge carriers and providing an absolute potential of a second value therein, means for storing charge in said first portions of said substrate, first means for reducing said first voltage on each pair of adjacent row conductor lines in sequence to a first level during a respective first period of time to cause said first portions of said substrate associated with said respective pair of row lines to be reduced in absolute potential to a third value less than said second value whereby charge stored in said first portions transfers into respective second portions of said substrate associated with said respective pair of row lines, second means for reducing on each of said column conductor lines in sequence said second voltage to a second level during a respective second period of time shorter than said first period of time and thereafter reestablishing said second voltage to cause said second portions of said substrate to be reduced in absolute potential to a fourth value less than said third value whereby charge stored in each of said second portions transfers into a respective first portion and back again to said second portion, each row line being included in two successive pairs of row lines whereby the first voltage thereon is reduced to said first level during an initial first period and also during a successive first period, means for collapsing said first voltage on each of said row lines for an interval at the end of said initial first period therefor and for simultaneously collapsing the second voltage on all of the column lines during said interval to cause charge in said first portions of the substrate associated with said respective row line to be injected into said substrate, means for sensing in sequence the signals induced on each of said pair of row lines during the transfer of charge from the first portions to the second portions of said substrate associated with said pair of row lines, means for obtaining a difference signal for each pair of signals appearing on said pair of row lines.

2. The combination of claim 1 in which said first voltage and said second voltage are approximately in the ratio of two to one.

3. The combination of claim 1 in which said means for storing charge includes means for exposing said substrate to a pattern of radiation.

4. The combination of claim 1 in which the reduction of said second voltage to said second level on a column line is balanced by the rise in said second voltage from said second level to the original value thereof on another column line.

5. In combination, a substrate of semiconductor material of one type conductivity having a major surface, first means forming a first plurality of charge storage sites for opposite type carriers adjacent said major surface of said substrate, second means forming a second plurality of charge storage sites for opposite carriers adjacent said major surface of said substrate, each coupled to a respective charge storage site of said first plurality to form a plurality of coupled pairs of charge storage sites, said coupled pairs of charge storage sites being arranged in an array of rows and columns, a plurality of row conductor lines and a plurality of column conductor lines, said first means including a first plurality of electrodes each insulatingly overlying a respective one of said storage sites of said first plurality, each of the electrodes of said first plurality in a respective row of sites being connected to a respective row line, said second means including a second plurality of electrodes, each insulatingly overlying a respective one said storage sites of said second plurality, each of the electrodes of said second plurality in a respective column of sites being connected to a respective column line, means for storing charge in said storage sites of said substrate, means for emptying a first row of storage sites of charge, means for transferring in sequence charge from each of the column line coupled storage sites of a second row of storage sites adjacent said first row of storage sites to a respective row line coupled storage site thereof and back by reducing for a short period of time and thereafter reestablishing the voltage on each of said column lines, means for sensing in sequence the signals induced on each of said pair of row lines coupled to said first and second rows of storage sites, means for obtaining a difference signal for each pair of signals appearing on said pair of row lines during the lowering of the voltages on said column lines in sequence.

* * * * *